United States Patent [19]

Ham

[11] Patent Number: 4,647,818
[45] Date of Patent: Mar. 3, 1987

[54] NONTHERMIONIC HOLLOW ANODE GAS DISCHARGE ELECTRON BEAM SOURCE

[75] Inventor: Mooyoung Ham, Glens Falls, N.Y.
[73] Assignee: SFE Technologies, San Fernando, Calif.
[21] Appl. No.: 600,674
[22] Filed: Apr. 16, 1984
[51] Int. Cl.[4] .......................... H01J 7/24; H05B 31/26
[52] U.S. Cl. ............................ 315/111.21; 313/231.31; 313/231.41; 315/111.31; 315/111.81
[58] Field of Search ....................... 315/111.21, 111.31, 315/111.81; 313/231.31, 231.41

[56] References Cited

U.S. PATENT DOCUMENTS

| | | | |
|---|---|---|---|
| 3,243,570 | 3/1966 | Boring | 313/231.31 X |
| 3,406,307 | 10/1968 | Dugdale | 313/231 |
| 3,515,932 | 6/1970 | King | 313/231.41 X |
| 3,566,184 | 2/1971 | Maskell | 315/111.81 |
| 3,831,052 | 8/1974 | Knechtli | 313/231.31 X |
| 3,970,892 | 7/1976 | Wakalopulos | 315/111.31 |
| 4,019,091 | 4/1977 | Schoenmakers | 315/111.81 |
| 4,297,615 | 10/1981 | Goebel et al. | 315/111.21 |
| 4,335,314 | 6/1982 | Geerk et al. | 250/492.3 |
| 4,339,691 | 7/1982 | Morimiya et al. | 315/111.21 |
| 4,458,180 | 7/1984 | Sohval et al. | 315/111.21 X |

OTHER PUBLICATIONS

Gas-Filled Electron Gun with a Plasma Anode, by A. A. Nechaev and others, translated from Pribory i Teknika Eksperimenta, No. 2, pp. 156–157, Mar.–Apr. 1983, original article submitted Jun. 12, 1981.
100 Jahre Elektronenrohren by H. Doring, NTZ Bd. 36 (1983) Heft 10.
Appartus and Technique for Pulsed Electron Beam Annealing for Solar Cell Production, by G. A. Landis and others, CH1644-4/81/0000-0976/1981 IEEE, pp. 976–980.
Satellite Orbit Control Using Ion Engines, by Isako Kudou, JEE, Dec. 1983, pp. 77–80, this article was originally published in the Sep. 1983 issue of Densoken News.
Commercial Advertisement by Xelionetics in 1984 Laser Focus Buyers Guide, p. 339.
Commercial advertisement by Electro-Optical Energy Systems Inc. in 1984 Laser Focus Buyers Guide, p. 338.
Wire–Ion–Plasma (WIP): A Revolutionary New Technology for E-Beam Curing, by G. Wakalopulos, D. K. Conti, Finishings Conference '83, Oct. 11–13, 1983, Cincinnati, Ohio, FC83-628.
Cold Cathode Ion Sources, Commercial Flyer by Denton Vacuum, Inc.
Mollenstedt, G. Voraussetzungen fur den technischen Einsatz von Elektronenstahlen aus einer Gasentladung von 1 bis 5 mA und 60 kV.Int.Konf. "Strahltechnik" Essen, FRG, 1980. Dusseldorf: Deutscher Verlag fur Schweisstechnik GmbH 1980, pp. 1–6.
Gruzdev, V. A.; Krejndel', J. E.; Torjan, O. E. Elektronnaja pucka s plazmennym katodom i vstroennym kompaktnyn generatorom gaza. Prib. Tekhn.Eksp. (1979) 5, pp. 169–171.
Holliday, J. H.; Ketteringham, T. A. Glow Discharge Electron Beams for Pipe Welding. GEC J. Sci.Technol. 44 (1978)3, pp. 105–110.
Wagner, I. V.; Volgov, E. I. Glimmentladungs-Elektronenstrahl-schweissen. ZIS Mitt. 19(1977)2, pp. 264–268.
Article in Chinese Journal of Semiconductor, vol. 2, No. 3, Aug. 1981, pp. 243–239.
"Deposition Technologies for Films and Coatings" by Rointan F. Bunshah, et al. Noyes Publications, Park Ridge, N.J., pp. 106–108, 163.

Primary Examiner—Saxfield Chatmon
Attorney, Agent, or Firm—Christie, Parker & Hale

[57] ABSTRACT

Apparatus and method for producing a plurienergetic electron beam source. The apparatus includes a housing which functions as an anode, the same having an electron emission window covered by an electron-transparent grid, a cathode body mounted within the housing and electrically isolated therefrom, the spacing between the cathode body and grid being sufficient to permit a gas discharge to be maintained between them having a plasma region substantially thinner than the cathode sheath region. The method involves the simultaneous feeding of gas between a cathode body and an anode grid, applying voltages of about 10 kV to 20 kV and regulating the gas feed rate and the voltage to maintain a discharge condition of the character described above.

18 Claims, 6 Drawing Figures

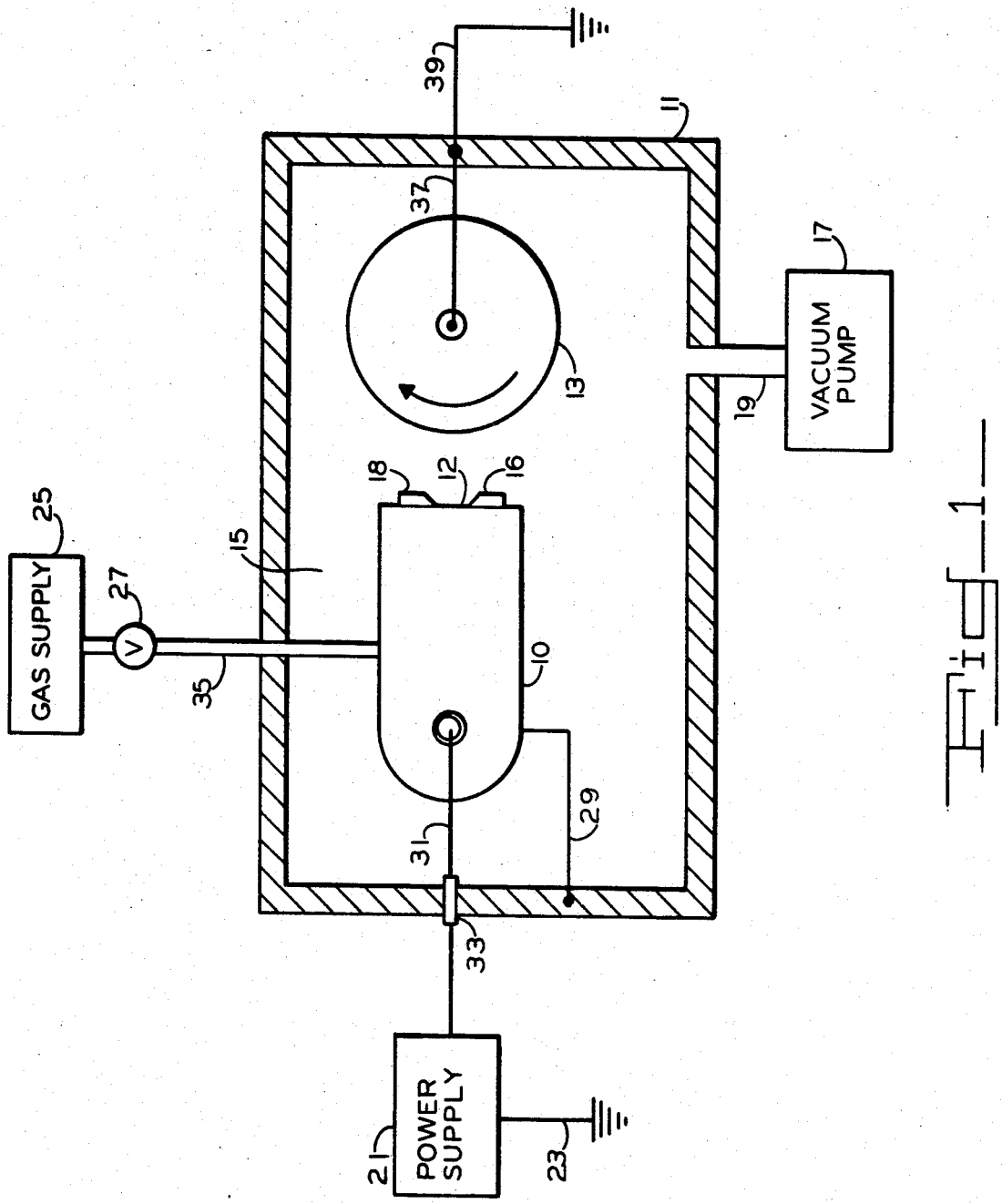

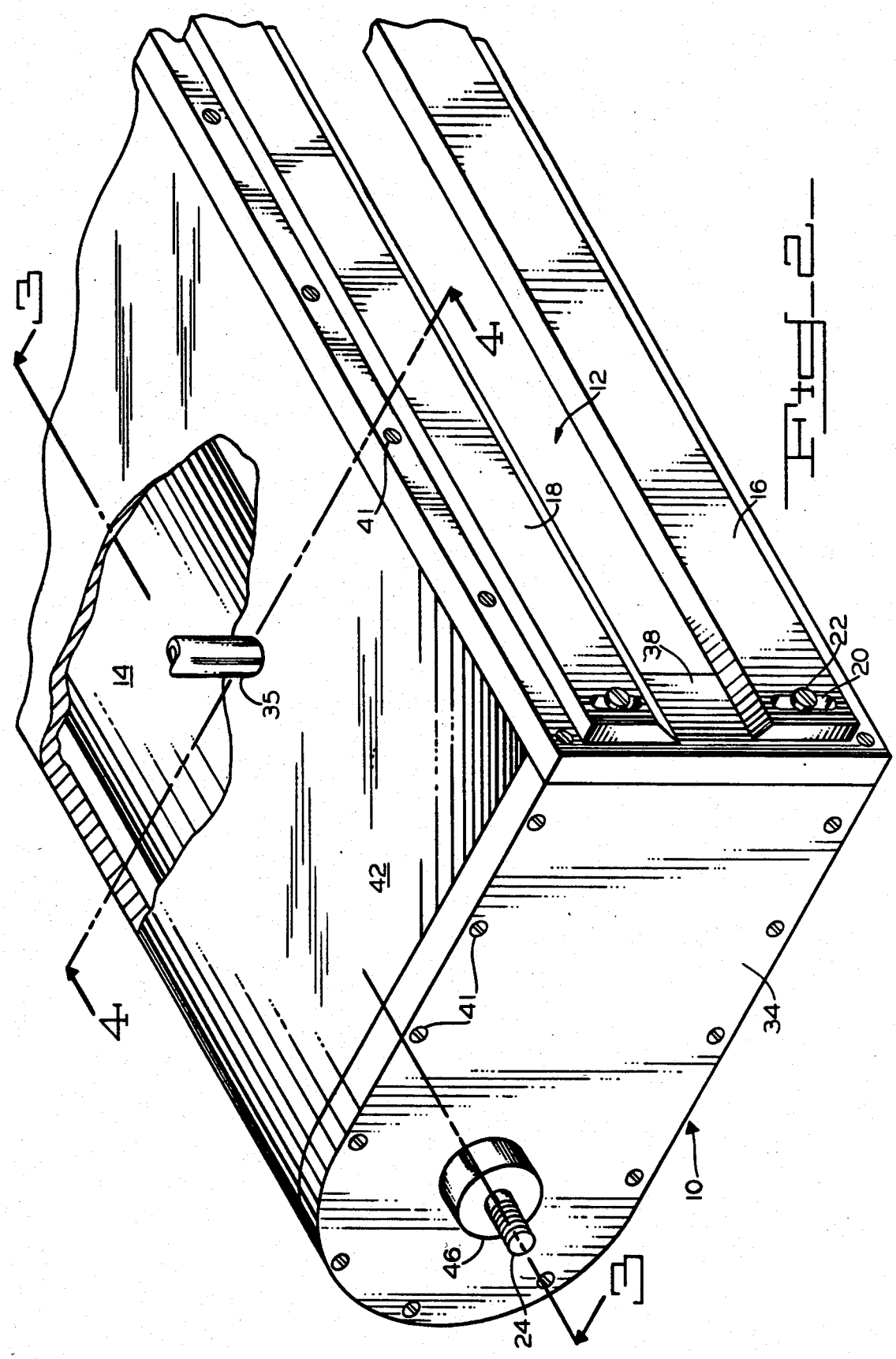

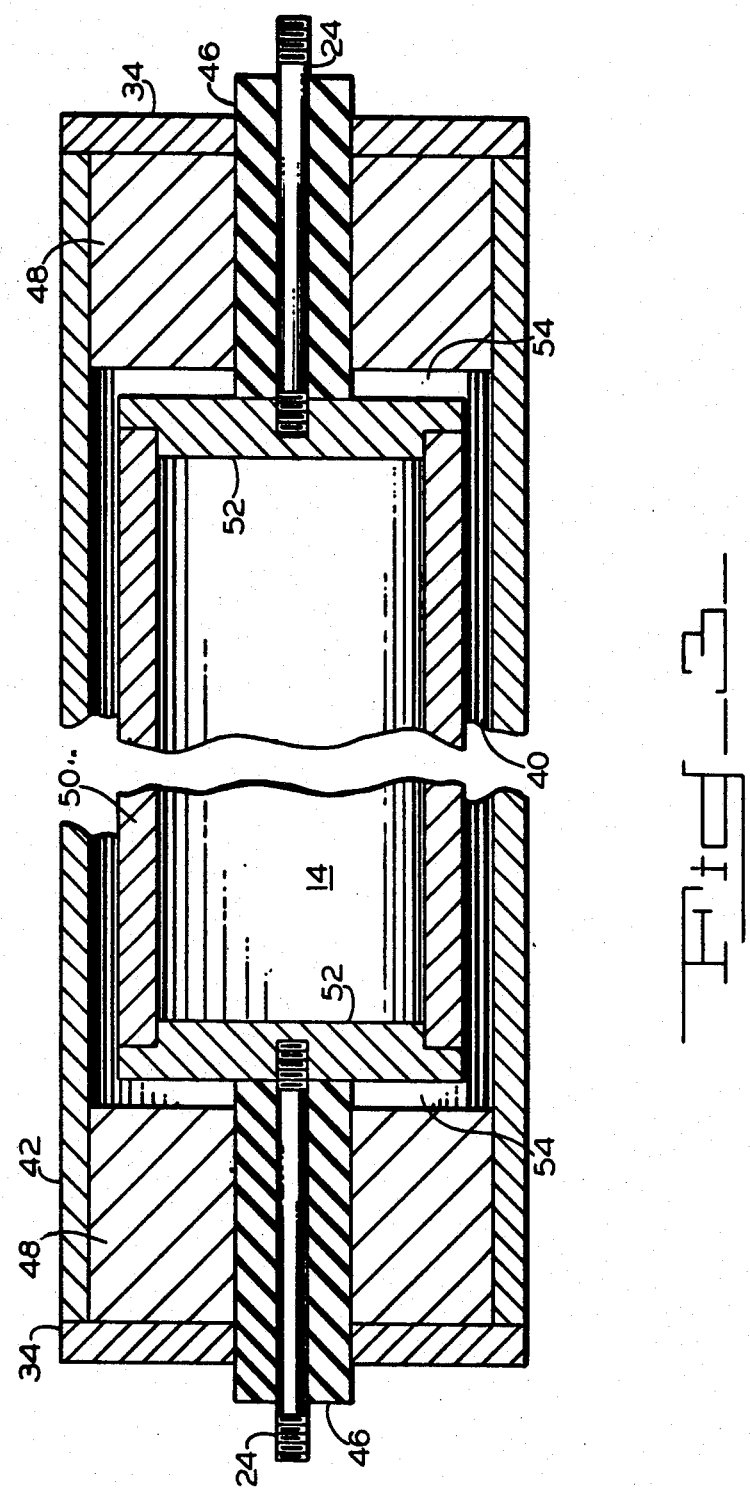

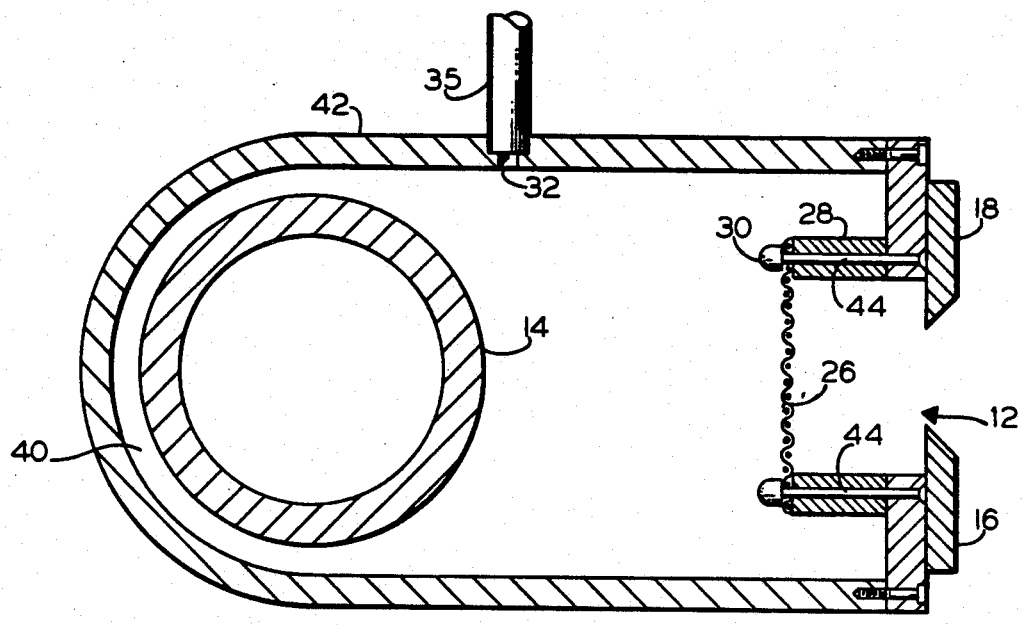
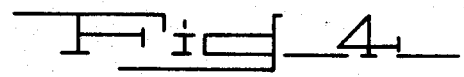

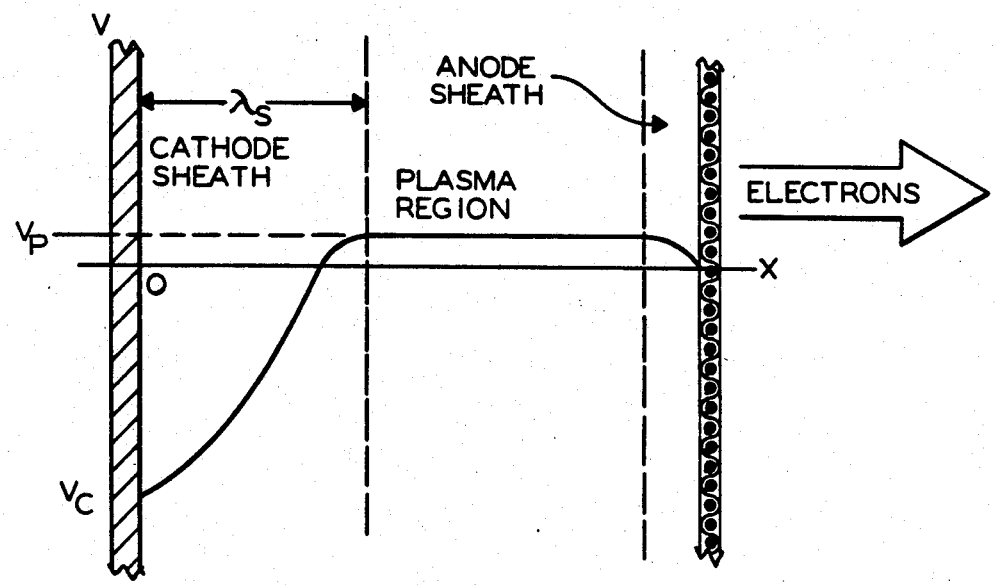
Fig_5A_
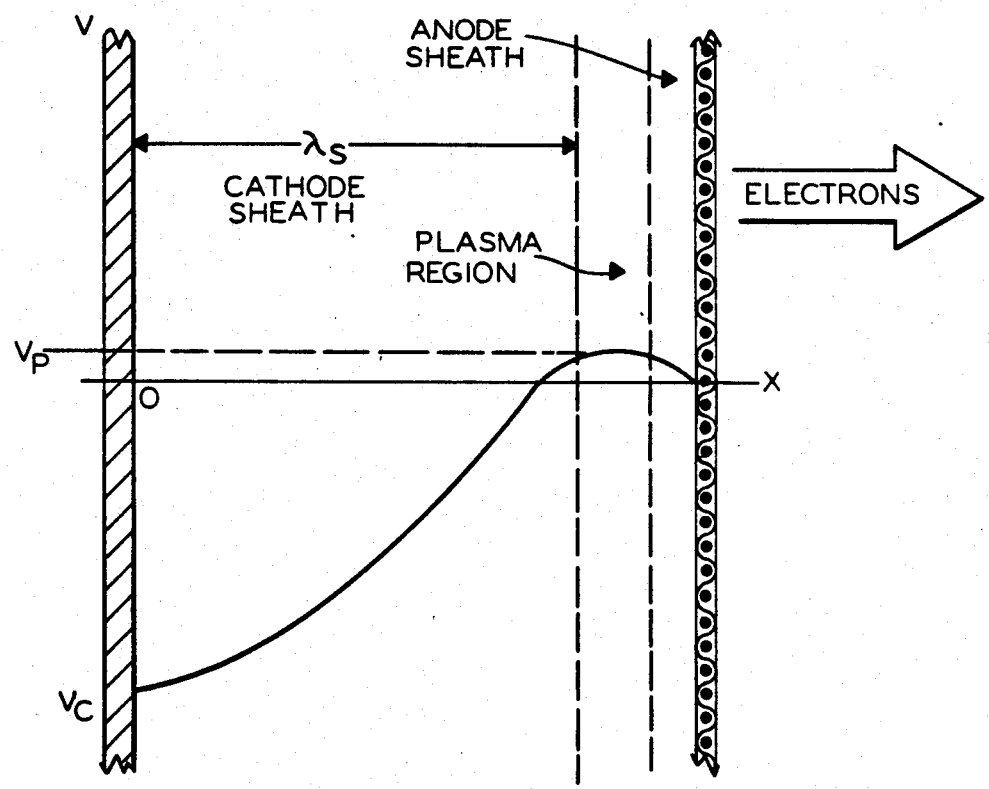
Fig_5B_

NONTHERMIONIC HOLLOW ANODE GAS DISCHARGE ELECTRON BEAM SOURCE

BACKGROUND AND SUMMARY OF THE INVENTION

Field of the Invention

This invention relates to an apparatus and a method for producing a plurienergetic electron beam, that is, an electron beam containing electrons with a relatively wide distribution of energies.

CROSS-REFERENCE

This invention is related to those contained in co-pending, commonly assigned patent application Ser. No. 562,779, filed Dec. 19, 1983, entitled, "Miniaturized Monolithic Multilayer Capacitor and Apparatus and Method for Making", which is incorporated herein by this reference. Particular attention is directed to the subject matter relating to FIGS. 12 and 13 of the referenced application, especially from page 17, line 19 through page 21, line 31.

BACKGROUND OF THE INVENTION

A recently developed method and apparatus for producing miniaturized monolithic multilayer capacitors involves the curing of a previously deposited layer of monomer material so that it becomes polymerized and possibly cross-linked as well. This curing can be accomplished with conventional filament-type electron beam sources, but with only limited success. A problem arising from the use of such electron beam sources for the indicated purpose is that an unacceptably large surface charging takes place on the workpiece, that is, on the dielectric layer of the capacitor being produced. The magnitude of the surface charge increases as the number of layers in the capacitor under production increases. Once the surface charge on the dielectric layers becomes large enough, it will discharge by sparking between and through the layers of the capacitor. These phenomena result in significant damage to the capacitor in the form of irregularities and holes in the dielectric layers as well as the electrode layers. Under these circumstances, it is very difficult to produce capacitors of uniformly high quality with predictable electrical properties falling within narrow tolerances. Since the sparking occurs at random, it becomes necessary to so closely examine and test each capacitor that the cost of producing them is greatly increased. Unfortunately, it is not always convenient or even possible to eliminate the surface charging problem by simple grounding techniques.

A theory which may explain why surface charging of a substrate takes place relates to the concept of secondary electron emission. When any material is irradiated with an electron beam, the material itself will be caused to emit electrons and these are usually referred to as "secondary electrons". Any material has its own secondary electron emission characteristic which may be expressed as its "emission coefficient". The emission coefficient for a given material is a function of temperature, surface condition, crystal orientation and perhaps other factors and it varies in a well known manner with the energy of the incoming electrons. If at a given time the number of secondary electrons being emitted by a material is lower than the number of incoming electrons being delivered to it, it will acquire a net negative surface charge. Although one might, in theory, adjust the energy of the incoming beam electrons to balance the number of primary and secondary electrons, and thus, avoid surface charging, this proves to be very difficult in practice. One reason for this difficulty is that the distributional range of electron energies produced by conventional electron beam sources is very narrow and the balance point energy level tends to vary during the irradiation process as temperature, surface condition and other factors change. The theory behind the present invention is that by employing a plurienergetic electron beam with a relatively broad distribution of electron energies, one can more easily balance the magnitude of charge added to a workpiece with the amount lost through secondary emission and thereby avoid the accumulation of significant net surface charges.

To be useful in a continuous process for making capacitors, such as that described in the above patent application, an electron beam source must be capable of functioning properly at vacuum pressures in the range of about $10^{-3}$ to $10^{-4}$ torr. This requirement arises because at higher pressures the other steps in the process, particularly the vapor deposition of electrode materials, cannot be satisfactorily performed.

Plasma electron beam sources are known in various configurations. While they offer various advantages in certain applications, they have certain characteristics which until now have rendered them incompatible for an operation such as the above-described one for making capacitors. First, in many plasma electron beam systems, the plasma comes in contact with the workpiece, a condition which would have ruinous effects in curing the very thin films of dielectric material in capacitor production. Secondly, many plasma electron beam sources are highly complicated and require several power supplies. Some of these are hazardous to work with in a production setting because they cannot easily be completely ground-shielded. Thirdly, the electron beam produced with plasma devices is frequently difficult to control and focus on a workpiece leading to unevenness in its treatment and irradiation where it is unwanted. Fourthly, known plasma electron beam sources are not suited for scaling up to produce electron beams of sufficient width and uniformity to permit their use in treating relatively wide moving layers of dielectric material. Fifthly, many plasma electron beam sources produce excessive heat. And finally, it is well known that plasma electron beam sources generally require frequent maintenance and adjustment.

It is, therefore, an object of this invention to provide an apparatus and a method for producing a plurienergetic electron beam source suitable for treating a layer of dielectric material without causing the accumulation of significant surface charges to occur thereon.

It is a further object of this invention to provide an apparatus and a method of the type indicated which can be used in multilayer capacitor production to cure previously deposited monomer layers so as to produce smooth, continuous and defect-free dielectric layers in the capacitors produced.

It is a further object of this invention to provide an apparatus and a method for producing a plurienergetic electron beam which will function under operating conditions compatible with the continuous vacuum deposition of electrode and dielectric layers.

It is a further object of this invention to provide an apparatus and method of the type indicated which will be economical and safe in use as well as simple in design.

It is a further object of this invention to provide an apparatus of the type indicated which can be completely ground-shielded and which operates from a single power supply.

It is a further object of this invention to provide an electron beam source of the type indicated which will be substantially maintenance free.

It is a further object of this invention to provide an apparatus of the type indicated, the external parts of which can be grounded in common with the workpiece so as to prevent any discharge or other electrical influence between them.

It is a further object of this invention to provide an apparatus and a method for producing a plurienergetic electron beam of sufficient width and uniformity to permit its use in treating a relatively wide moving layer of material.

It is a further object of this invention to provide an apparatus and a method of the type indicated which can be employed without the production of excessive heat.

These and other objects of the invention are achieved through the use of an electrically conductive substantially closed housing having an electron emission window covered by an interiorly mounted and preferably recessed electrically conductive electron extractor grid in electrical contact with the housing, a cathode body mounted within and spaced apart from the housing in an opposing relation to the grid and electrically insulated from the housing and grid, at least one port for introducing an ionizable gas into the housing and means for connecting a voltage source between the cathode and the housing and grid assembly. The spacing between the cathode and the electron extractor grid is sufficient to permit a gas discharge to be maintained between them during operation, said discharge preferably characterized by having a relatively thick cathode sheath region and a relatively thin plasma region. The spacing between the cathode body and the adjacent housing is too small for any significant gas discharge to occur between them.

The method of this invention involves introducing an ionizable gas between a cathode and an electron-transparent anode grid, impressing a negative voltage on the cathode with respect to the anode; and regulating the voltage and the gas pressure so as to maintain a gas discharge between the electrodes preferably characterized by having a relatively thin plasma region as compared with its cathode sheath region.

Other objects, purposes and advantages of the invention will appear from the description of the drawings which follows.

BRIEF DESCRIPTION OF THE DRAWINGS

FIG. 1 is a schematic diagram showing an electron beam irradiation system incorporating the invention.

FIG. 2 is a perspective view, with parts broken away, of the preferred embodiment of the electron beam source of the invention.

FIG. 3 is a cross-section view of the embodiment shown in FIG. 1 taken on line 3—3 therein.

FIG. 4 is another cross-section view of the embodiment shown in FIG. 1 taken on line 4—4 therein.

FIGS. 5A and 5B are graphical representations comparing the conventional mode of operation for a plasma electron beam source with the preferred mode of operation of the present invention.

DETAILED DESCRIPTION OF THE INVENTION

FIG. 1 shows the preferred embodiment of the electron beam source 10 of this invention mounted within a vacuum chamber 11. Vacuum chamber 11 is connected to a vacuum pump 17 by means of conduit 19. Vacuum pump 17 may be any conventional device capable of controllably evacuating the ambient space 15 within vacuum chamber 11 down to a pressure of about $10^{-5}$ torr under the operating conditions to be described herein. Electron beam source 10 is connected to a gas supply 25 through gas line 35. The flow of gas is regulated by adjustable valve 27. The gas to be supplied may be Argon or another suitable ionizable gas. Electron beam source 10 is also connected to a power supply 21 through electrical conduit 31, which passes through the vacuum chamber housing by means of a suitable insulator 33. The housing of electron beam source 10 is grounded through the vacuum chamber structure 11, as shown schematically by line 29 connecting source 10 with chamber 11. Vacuum chamber 11 is typically made of a metal which is electrically conductive and it, in turn, is grounded through wire 39. Power supply 21 may be any suitable supply for controllably providing DC voltage to source 10 in the range from about $-10$ kV to about $-30$ kV. It too is grounded by means of grounding lead 23.

Still referring to FIG. 1, the electron beam source 10 has an electron emission window 12, the vertical opening or height of which may be adjusted by adjusting plates 16 and 18 in a manner to be described below. A target surface 13 is positioned to receive radiation being emitted through window 12. Target surface 13 is hereby represented to be a rotatable drum, that being one convenient and useful configuration for the treating of dielectric layers in a continuous capacitor manufacturing process. Thus, a monomer layer of dielectric material deposited on surface 13 by any suitable apparatus (not shown) will continuously pass electron emission window 12 of the electron beam source 10. It will be understood that the structures just described represent only one arrangement for using the capabilities of the present invention. Various other arrangements using static or moving surfaces may, of course, be used. Surface 13 is desirably grounded by connection with the structure of vacuum chamber 11 through a suitable lead 37 or other means.

FIG. 2 shows the electron beam source of FIG. 1 in an enlarged perspective view. The basic structural member of source 10 is an enclosed housing which includes a U-shaped main shell 42, a pair of end covers 34 and a front cover 38. These parts may be made of any suitable electrically conductive material of suitable strength such as aluminum having a thickness of about 0.5 in or 1.2 cm. They may be assembled in any conventional way such as by using screws 41. It is important that the entire housing be substantially gas tight in order to achieve the most efficient operation and use of the invention. Thus, the parts are machined on the surfaces where they are joined together in order to keep gas leakage to a minimum. This method of construction also serves the purpose of insuring reliable electrical contact between the parts of the housing. This too is important because the housing serves as the anode of electron beam source 10, as will be more fully appreciated as this description proceeds.

FIG. 2 also shows, through the broken away portion of shell 42, that a cathode body 14 extends across the rear of source 10. Electrical power connectors 24 protrude through end covers 34 and are connected internally with cathode body 14 in a manner to be more completely described with reference to FIG. 3. Gas line 35 is connected to a gas feed port 32 (See FIG. 4) machined into main shell 42. In order to achieve an even distribution of gas within source 10, it is desirable to employ a plurality of such gas lines and ports through both the top and bottom legs of the U-shaped housing shell 42.

Front housing cover 38 has a window 12 cut therein in the form of an elongated slit. It may be seen (See FIG. 4) that the longitudinal axes of cathode body 14 and window 12 are generally parallel and that the cathode is mounted within the housing of source 10 in an opposed line of sight relationship with window 12. The vertical opening or height of the opening of window 12 may be adjusted by a pair of plates 16 and 18 which are mounted for sliding movement towards and away from one another. This is accomplished through the use of hold down screws 22 in cooperation with adjustment slots 20 which are cut into plates 16 and 18.

FIG. 3 shows the structure of cathode body 14 in greater detail and the manner in which it is mounted within the housing of electron beam source 10. Cathode body 14 is comprised of a hollow cylindrical member 50 having end caps 52 press fitted therein. Power connector rods 24 are mechanically and electrically connected to end caps 52 and extend outwardly through end covers 34. In order to provide electrical isolation between cathode body 14 and the housing of source 10, a feedthrough device 46 is used. Although feedthrough devices are typically comprised of several parts, feedthrough device 46 is shown here schematically as simply representing its functional purpose of electrically insulating power connector 24 from the housing of electron beam source 10. Such feedthrough devices are commercially available and one which has performed satisfactorily in the subject invention is model FT58-009 manufactured by CHA Industries of California, having a rating of 12 kV and 100 amperes. That model and others like it are so configured that they can be mounted through the housing of source 10, as shown in FIG. 3, in a gas-tight manner. Metal spacing cylinders 48 merely serve to maintain reasonably uniform spacing around cathode body 14. Thus, the cathode separation space 40 and end spaces 54 are made to be comparable in size in order to avoid any concentration of the electric field at any point between cathode body 14 and the other parts of source 10 which could cause arcing and electrical breakdown between these structures.

Referring now to FIG. 4, cathode body 14 is seen to be cylindrical in shape and concentrically mounted within and evenly spaced from the curved portion of main housing shell 42. The separation space 40 between cathode body 14 and the adjacent portion of shell 42 is uniform. This uniform cathode separation space 40 and end spaces 54 must, of course, be sufficiently large to avoid any arcing between housing 42 or spacing cylinders 48 and cathode body 14. At the same time, however, it must be sufficiently small so that no appreciable gas discharge can occur between them.

An electron emission grid 26 is mounted in recess in window 12 by means of grid mounting frame 28 and frame cover 30. These structures are held in tight electrical contact by means of long frame cover screws 44, the heads of which are countersunk in front housing cover 38. It may be observed in order to avoid any concentration of electric field intensity in the region around them which would distort the pattern of electron emission. Grid 26 may be a tungsten mesh having a high transparency to the passage of electrons. Mounting grid 26 in recess serves to enhance its function of extracting electrons from within source 10.

The distance between cylindrical cathode body 14 and electron extractor grid 26 is an important consideration in achieving the maximum advantage of this invention. As indicated earlier, an electron beam containing electrons with a fairly wide distribution of sufficiently high energies can be generated if a special form of gas discharge can be maintained between electrode body 14 and grid 26. This special gas discharge is characterized by having a relatively thin plasma region and a relatively thick cathode sheath region. "Thinness" or "thickness", as used in this context, refers to the dimension of the sheath or plasma region, as the case may be, running between the cathode body 14 and grid 26.

FIGS. 5A and 5B are graphical representations of the change in potential (V) with distance (X) from a cathode to an anode while a gas discharge is maintained between them. In a gas discharge between a pair of electrodes, the thickness of the cathode sheath ($\lambda_s$) can be approximated with the use of the following formula:

$$\lambda_s \approx \left\{ \sqrt{\frac{4\pi}{9} \left(\frac{T_-}{T_+}\right)^{1/2} \left(\frac{V'_c}{T_-}\right)^{3/2}} \right\} \lambda_d$$

where
   $V'_c$ = the sum of the cathode potential ($V_c$) and the plasma potential ($V_p$),
   $T-$ = the electron temperature in the gas discharge,
   $T+$ = the ion temperature in the gas discharge; and
   $\lambda_d$ = the Debye length.

Furthermore, the Debye length varies inversely with the square root of the neutral gas pressure within the glow region. For low vacuum, say about $10^{-1}$ to $10^{-2}$ torr, and at appropriate voltages, a normal gas discharge would occur in which virtually the entire space between the electrodes becomes a glow discharge region. This is the conventional mode of operation for most plasma sources in which the potential of the plasma remains fairly uniform throughout its thickness, that is, along the X axis, as shown in FIG. 5A. While it is possible to extract electrons from such a gas discharge, they will be of relatively low energy. Even electrons whose birthplace is in the cathode sheath region where the potential gradient is high will have their energy dissipated substantially by the time they are extracted at the anode grid because they are required to pass through a thick plasma region. In the preferred embodiment of the subject invention, however, a continuous gas discharge is maintained in which the plasma region is relatively thin while the cathode sheath region is relatively much thicker. It is believed that this condition occurs due to the ability of the apparatus of the subject invention to operate in a high vacuum environment in the range of about $10^{-3}$ to $10^{-4}$ torr. In that pressure range at suitable voltages levels of say $-10$ kV to $-20$ kV, the thickness of the cathode sheath is considerable and, by limiting the cathode-to-grid distance, the plasma region can apparently be made relatively thin. The preferred embodiment of this invention takes advantage of this phenomenon by appropriately spacing the cathode body 14 and grid 26 (See FIG. 3) to produce a special gas discharge of the indicated character. Then, electrons having their birthplace within the cathode sheath region will need to pass through only a thin plasma region and the probability that such electrons will have their energies dissipated becomes substantially reduced. Thus, it has been found that the electron beam generated with the present invention is especially suited for use in the capacitor-making process described earlier because, under the indicated operating conditions, it contains electrons of sufficiently high energy to adequately cure monomer layers of dielectric materials having thicknesses ranging up to about 2 microns without any noticeable surface charging of such layers. Also since electrons emitted through grid 26 can originate from many places within the relatively thick cathode sheath region, a wide distribution of electron energies is produced by the subject invention. As noted earlier, this last factor is believed to be the key to avoidance of the surface charging problem.

It will be understood that gas ions present within electron beam source 10 are not emitted through grid 26. Rather, they are repelled by grid 26 and attracted by cathode body 14.

EXAMPLE

An electron beam source has been constructed having the same general configuration as that shown in FIGS. 2, 3 and 4. The emission window 12 is approximately 14 in (35.6 cm) wide and the overal width of the source is 20 in (50.8 cm). The height of the window 12 is 2 in (5.1 cm) and the overall height of the source using outside measurements is 4.5 in (11.4 cm). The distance from the grid 26 to the cathode body 14 on a line running through their centers is 3.5 in (8.9 cm), the grid being recesses from the inside surface of front housing cover 38 by about 1 in (2.5 cm). The diameter of cathode body 14 is about 3 in (7.6 cm) and the separation space between the cathode body 14 and the curved portion of housing shell 42 is about ⅜ in (1.0 cm). Cathode body 14 is made of cold rolled steel and is hollow. The main housing shell 42 was made of ½ in (1.3 cm) aluminum. The end covers were made of aluminum with a thickness of ⅜ in (1.0 cm) and the front housing cover 38 was made of cold rolled steel with a thickness of about ⅜ in (1.0 cm), as was the grid mount frame 28. The grid 26 is a tungsten mesh having a transparency to electrons of about 80%. Water jackets were mounted on the outside of both legs of the U-shaped housing shell for cooling the source during operation. However, it is believed that the source will operate without producing excessive heat and these jackets may be unnecessary.

This model has been operated in a vacuum chamber which was pumped down to about $10^{-3}$ torr. A voltage of about $-11$ kV was impressed upon the cathode body 14 and the housing was grounded. Gas was then introduced until a current flow of about 120 mA through the power line 31 was reached. The rate of gas flow was approximately 400–500 cc/min. The pump maintained a vacuum of about $10^{-3}$ torr. Water was circulated through the water jackets. Layers of acrylate monomers having a thickness of about one micron were cured using the above-described apparatus and operating parameters. The resulting polymer films were extremely smooth and continuous showing virtually no defects.

In testing this model, a flat sheet of copper was irradiated using operating parameters similar to those described above for about 3 minutes at a distance of about 5 inches from the electron beam source 10. The copper sheet was suspended in a vacuum chamber in front of the gun and was ungrounded. The scorching pattern produced on the sheet indicated a well collimated beam with a very even distribution of electrons having a pattern similar to that of the emission window 12 with the highest concentration occurring along its center line parallel to the axis of the cathode body 14.

Also, during operation of this source using operating parameters similar to those described above, a faint glow is observable within the housing behind the grid.

What is claimed:

1. A gas discharge electron beam source for use in a workspace evacuated and maintained at a pressure at least as low as about $10^{-3}$ torr, comprised of:
    a substantially closed housing made of electrically conductive material and having at least one port for the introduction of an ionizable gas into its interior, and also having at least one electron emission window;
    an electron extractor grid at least partially transparent to the passage of electrons and made of electrically conductive material mounted across the window and in electrical contact with the housing;
    a cathode body made of electrically conductive material mounted within the housing, but electrically isolated therefrom, and spaced apart from the housing in an opposed relationship with the grid, the space between the grid and the cathode body being chosen so as to permit a gas discharge having a cathode sheath region with a thickness greater than that of its plasma region to be maintained between them during operation and the space between the cathode body and the adjacent housing being too small for any appreciable discharge to take place between them during operation; and
    means for connecting a voltage source between the cathode and the housing, so that while the potential of the cathode is made about negative 10 kV with respect to the housing and grid and a sufficient amount of ionizable gas is present between the cathode and the grid, gas discharge occurs between them and free electrons thereby created are accelerated toward and pass through the grid and emission window in a continuous stream of plurienergetic electrons while substantially no gas ions are so emitted.

2. The invention of claim 1 wherein the grid is recessed within the housing toward the cathode body.

3. The invention of claim 1 or 2 wherein the grid is substantially planar and the cathode body is comprised of a hollow cylindrical member.

4. The invention of claim 1 wherein the cathode body is made of copper, the housing aluminum and the grid tungsten in a mesh about 80% transparent to electrons.

5. The invention of claim 1 or 2 wherein the window has the shape of an elongated slit in the housing and the cathode body has a cylindrical surface facing the window, their longitudinal axes being substantially in parallel.

6. The invention of claim 5 wherein the cathode body is made of steel, the housing aluminum and the grid tungsten in a mesh about 80% transparent to electrons.

7. The invention of claim 1 or 2 in combination with means for maintaining a vacuum ambient to the source of at least as low as $10^{-3}$ torr.

8. The invention of claim 7 in further combination with means for controllably feeding an ionizable gas into the interior of the housing and means for applying a suitable operating potential to the cathode body while maintaining the housing and grid at ground potential.

9. The invention of claim 1 or 2 wherein the spacing between the cathode body and the grid exceeds the resulting thickness of the cathode sheath region for preselected gas discharge operating conditions and the spacing between the cathode body and the adjacent housing is less than said thickness.

10. The invention of claim 1 or 2 wherein the spacing between the cathode body and the grid is adjustable.

11. The invention of claim 1 or 2 wherein the housing is substantially symmetrically arranged about the column of space running between the cathode body and the grid.

12. A method of generating a continous stream of plurienergetic electrons comprising the simultaneous steps of:
    introducing an ionizable gas between a cathode body and an electron-transparent anode in a vacuum at least as low as about $10^{-3}$ torr;
    impressing a negative voltage of about 10 kV on the cathode with respect to the anode;
    setting the distanoe between the cathode body and the anode; and
    regulating the gas pressure so as to maintain a gas discharge between the cathode and anode characterized by having a plasma region with a thickness less than the thickness of its cathode sheath region.

13. A method for curing monomer layers of dielectric materials without noticeable surface charging comprising the steps of:
    introducing an ionizable gas between a cathode body and an electron-transparent anode in a vacuum at least as low as about $10^{-3}$ torr;
    impressing a negative voltage on the cathode with respect to the anode;
    setting the distance between the cathode body and the anode;
    regulating the gas pressure so as to maintain a gas discharge between the cathode and anode characterized by having a plasma region with a thickness less than the thickness of its cathode sheath region; and
    exposing the monomer layers to be cured to the continuous stream of plurienergetic electrons generated by the preceding steps.

14. The method of claim 13 comprising the additional step of enclosing the cathode body and anode in a substantially closed housing having an electron emission window at the anode an in electrical contact with the anode.

15. The method of claim 14 comprising the additional step of moving the monomer layers to be cured past the electron emission window.

16. The method of claim 12 wherein the distance between the cathode body and the anode is set at about three and one-half inches.

17. The method of claim 13 wherein the negative voltage impressed on the cathode with respect to the anode is about 10 kV.

18. The method of claim 13 wherein the distance between the cathode body and the anode is set at about three and one-half inches.

* * * * *